United States Patent [19]
Masini et al.

[11] Patent Number: 5,796,302
[45] Date of Patent: Aug. 18, 1998

[54] SINGLE POLE NEGATIVE FEEDBACK FOR CLASS-D AMPLIFIER

[75] Inventors: Marco Masini, Milan; Stefania Boiocchi, Certosa; Edoardo Botti, Vigevano, all of Italy

[73] Assignee: SGS-Thomson Microelectronics S.r.l., Agrate Brianza, Italy

[21] Appl. No.: 607,601

[22] Filed: Feb. 27, 1996

[30] Foreign Application Priority Data

Feb. 28, 1995 [EP] European Pat. Off. ............ 95830063

[51] Int. Cl.$^6$ .................................................. H03F 3/38
[52] U.S. Cl. .................................................. 330/10; 330/251
[58] Field of Search .......................... 330/10, 207 A, 330/251; 381/120, 121

[56] References Cited

U.S. PATENT DOCUMENTS

| | | | |
|---|---|---|---|
| 3,537,022 | 10/1970 | Regan | 330/10 |
| 4,403,196 | 9/1983 | Grandmont | 330/10 |
| 5,218,315 | 6/1993 | Turner | 330/10 |

OTHER PUBLICATIONS

European Search Report from European Patent Application 95830063.4, filed Feb. 28, 1995.

Elektor Electronics, vol. 5, No. 9, Sep. 1979 Canterbury, GB, pp. 9.46–9.48, P. Geelen "Self-Oscillating PWM Amplifier".

Electronique Industrielles, No. 22, Oct. 1981 Paris, FR, pp. 37–39, L. Pierre "Sorties De Puissance Pour Amplificateurs Operationnels".

*Primary Examiner*—Steven J. Mottola
*Attorney, Agent, or Firm*—Wolf, Greenfield & Sacks, P.C.; James H. Morris

[57] ABSTRACT

A single-pole negative feedback D-class amplifier having first and second input terminals for coupling to a signal source and an output terminal through which it transfers pulse modulated signals to a demodulating filter. A first resistor is feedback connected between the output terminal and an input circuit node connected to the second input terminal. A second resistor is connected between the input circuit node and the second input terminal. A capacitor is connected between the input circuit node and the first input terminal.

13 Claims, 4 Drawing Sheets

SINGLE POLE NEGATIVE FEEDBACK FOR CLASS-D AMPLIFIER

BACKGROUND OF THE INVENTION

1. Field of the Invention

This invention relates to D-class or two-state amplifiers, and more particularly to a D-class amplifier adapted to be integrated monolithically for use in audio applications.

2. Discussion of the Related Art

It is desirable in audio applications that the efficiency of audio amplifiers be improved over that of conventional B- or AB-class stages, without introducing harmonic distortion.

Further, there exists a limitation to the power dissipation of an audio amplifier of the conventional monolithically integrated type.

A solution to this problem is provided by D-class amplifiers in which active power circuit elements are used, such as switches which are alternately driven to saturation and cut-off at a high switching speed.

While the operation of traditional amplifiers is limited to increasing the voltage and current of input signals without significantly altering their waveforms (unless saturation occurs), D-class amplifiers provide, prior to the amplification proper, for the encoding of the information or audio signal by a particular pulse modulation system.

The required analog signal for driving the loudspeaker is then obtained by appropriate filtering downstream of the final stage of the amplifier.

The modulation step converts the audio signal to be amplified into a sequence of pulses of the square waveform type, having a pulse duration that is proportional to an instant amplitude of the input signal.

This type of pulse modulation is also known as PWM (Pulse-Width Modulation), and affords very high efficiency levels, in principle of up to 100%.

The resultant signal, having a much different waveform from the original one, is complete with all the information.

The D-class or two-state amplification technique is well known to those skilled in the art, and the problems it involves are dealt with, for example, in an article "Modulated Pulse Audio Power Amplifiers for Integrated Circuits" by H. R. Camenzind, IEEE Transactions on Audio and Electroacoustics, Vol. AU-14, No. 3, September 1966.

A major limiting factor to the use of two-state amplifiers in audio applications is that the distortion introduced into the audio signal may not be consistent with a high quality of sound reproduction, unless special measures are taken, such as very high switching rates, which add to the system complexity.

In addition, the demodulation filter downstream from the amplifier, which is used for driving the load, is typically an LC filter, i.e. a low-pass filter having a greater number of poles than one.

In order to reduce distortion and offset, negative feedback is provided in the system.

Shown in FIG. 1 is a block diagram of a conventional solution used by those skilled in the art, wherein the negative feedback is tapped off downstream from the demodulation filter.

However, the feedback loop must also be provided with some suitable compensation because, as mentioned above, the demodulation filter has at least two poles.

This technique is described, for instance, in an article P.C1-1C1-31 of the Unitrode Power Supply Design Seminar (SEM-700).

FIG. 2 shows a different way of obtaining an oscillator which automatically has a degree of feedback.

This solution is described in U.S. Pat. No. 3,294,981 to Bose; it is not capable, however, of suppressing distortions brought about by the integrator.

A more recent solution to the problem of the dual pole of the demodulation filter is disclosed in another Bose U.S. Pat. No. 4,456,872, whereby a D-class amplifier with current feedback is provided.

In practicing this solution, however, a disadvantage is that small signals which are sensitive to noise and switching glitches are processed.

The underlying technical problem of this invention is to provide an amplifier of the negative feedback, two-state type which can provide low harmonic distortion and high stability using very simple circuitry.

SUMMARY OF THE INVENTION

In one embodiment of the present invention, a power amplifier has first and second inputs for receiving an input signal from a signal source and an output for providing an output signal. The power amplifier includes a modulation circuit that converts the input signal to a pulse signal having a pulse duration proportional to an amplitude of the input signal, a first circuit element having a predetermined impedance connected between the output of the amplifier and a second input circuit node, a second circuit element having a predetermined impedance connected between the second input circuit node and the second input of the amplifier, and a capacitive element connected between the first input of the amplifier and the second input circuit node.

In another embodiment of the present invention, a power amplifier of the two-state type has first and second inputs for receiving an input signal from a signal source. The power amplifier includes a differential stage, a bistable type multivibrator circuit coupled to the differential stage, a level-translating output stage coupled to the multivibrator circuit, a first circuit element having a predetermined impedance connected between an output terminal of the level-translating stage and a second input terminal of the differential stage, a second circuit element connected between the second input of the power amplifier and the second input terminal of the differential stage, and a capacitive element connected between the first input of the amplifier and the second input terminals of the differential stage.

In yet another embodiment of the present invention, an audio system has first and second inputs for receiving an input signal. The audio system includes an amplification circuit that receives the input signal and provides an output amplified signal, a first circuit element having a predetermined impedance connected between an output of the amplification circuit and a second input of the amplification circuit, a second circuit element having a predetermined impedance connected between the second input of the amplification circuit and the second input of the audio system, a capacitive element connected between the first input of the audio system and the second input of the amplification circuit, a demodulation filter coupled to the amplification circuit that provides a filtered amplified signal, and an audio load coupled to the demodulation filter.

In still another embodiment of the present invention, a power amplifier of the two-state type has first and second inputs for receiving an input signal and an output for providing an output signal. The power amplifier includes a modulation circuit that converts the input signal to a pulse signal having a pulse duration proportional to an amplitude of the input signal, and feedback means for providing a feedback signal from the output of the power amplifier to first and second inputs of the modulation circuit.

BRIEF DESCRIPTION OF THE DRAWINGS

The features and advantages of a two-state amplifier according to embodiments of the invention will be apparent from the following description of an embodiment thereof, given by way of example with reference to the accompanying drawings.

In the drawings.

DETAILED DESCRIPTION

Figure 1:
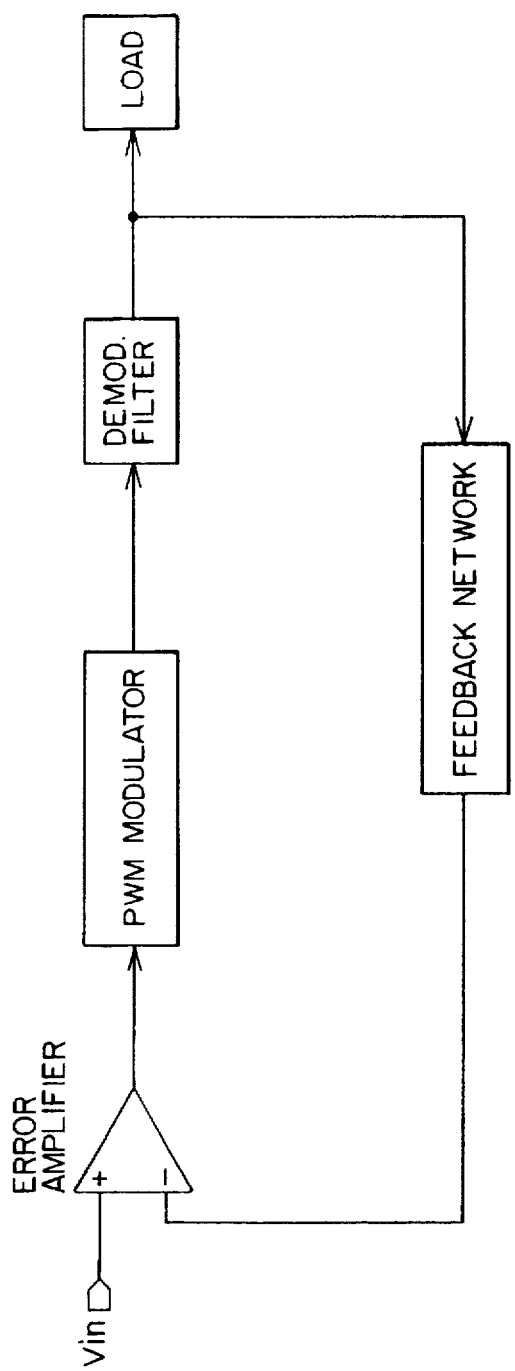
FIGS. 1 and 2 show block diagrams of the known technical solutions discussed hereinabove.
Figure 2:
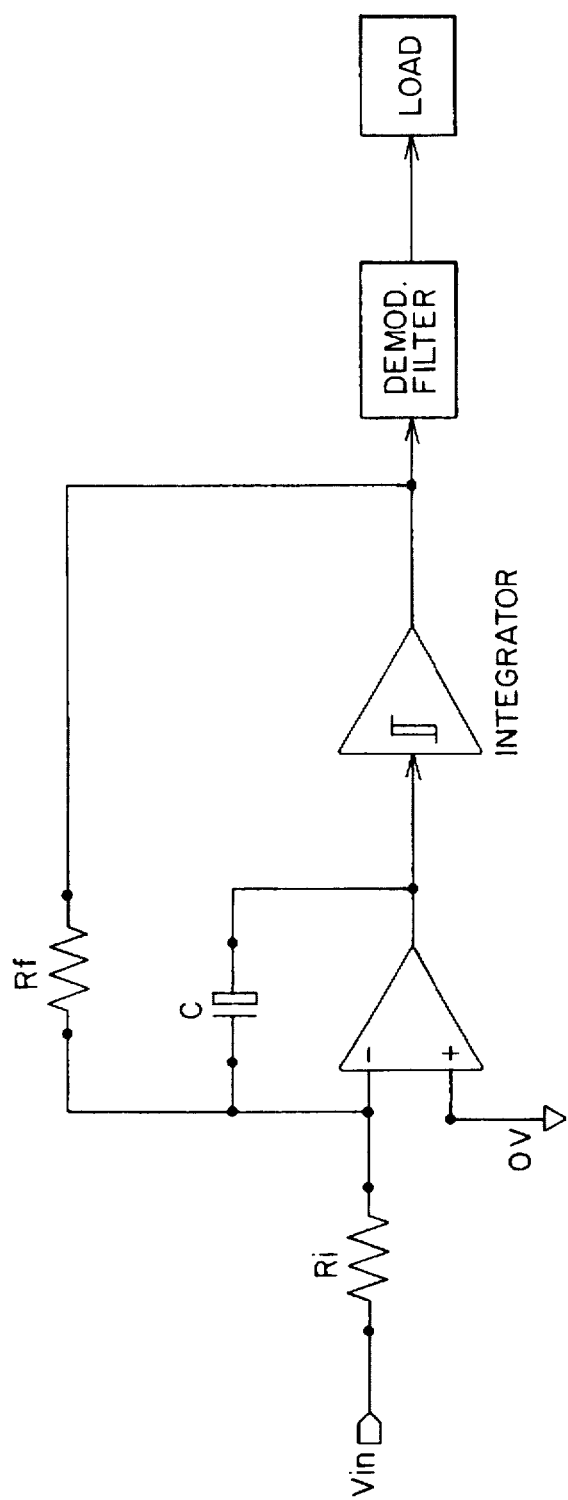
Figure 3:
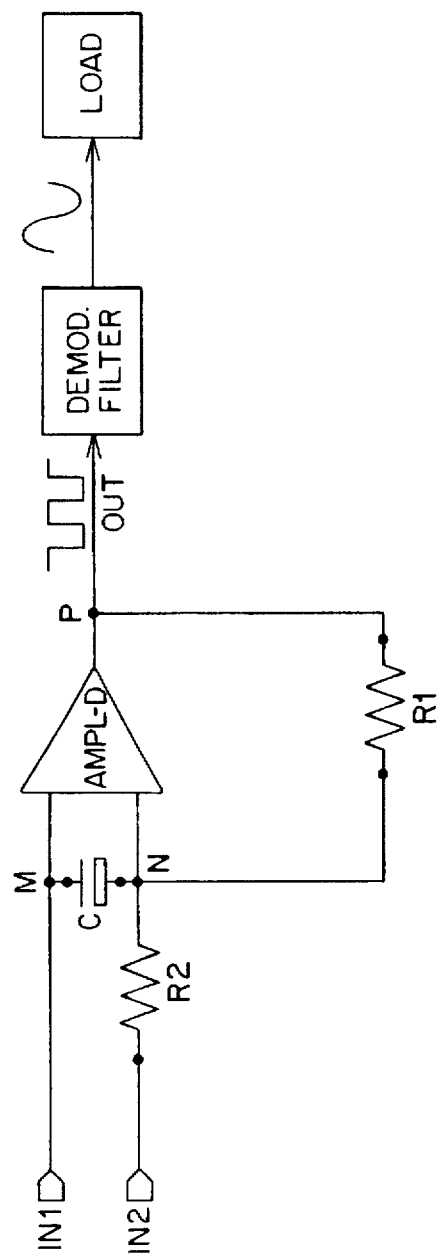
FIG. 3 shows a general scheme for a negative feedback two-state amplifier according to one embodiment of the invention.

Shown in FIG. 3 is a general scheme for a negative feedback, D-class or two-state amplifier, according to one embodiment of the invention wherein individual blocks are used to also indicate the demodulation filter downstream from the amplifier and a load, which may be a loudspeaker in audio applications.

The feedback topology shown is a universal one, and accordingly applicable to the amplifier regardless of its implementation circuit-wise and of its application.

The D-class amplifier AMPL-D has first IN1 and second IN2 input terminals for coupling to a signal source, and an output terminal OUT through which a pulse modulated signal is transferred to the low-pass demod filter for demodulation into an analog load drive signal.

A first resistor R1 is feedback connected between the output terminal OUT and an input node N of the amplifier.

A second resistor R2 is connected between node N and the second input terminal IN2.

In accordance with the embodiment of the invention, also connected between the first input terminal IN1 and the input node N is a capacitor C of suitable capacitance.

More generally, first and second circuit elements with a predetermined impedance, plus a suitable capacitive element, may be used to meet specific design requirements.

With a D-class amplifier fed back in accordance with this novel topology, the following results can be obtained:

the loop gain has a single pole (p=(R1//R2)*C), whereby the possibility exists in principle of increasing the loop gain as desired without encountering instability problems; and the pole of the loop gain can be arranged, at the designing stage, to be within the audio frequency band, without affecting the frequency response of the amplifier but advantageously reducing the residual ripple caused by the output square wave and being input back by the feedback resistor $R_1$.

This can be readily verified by one skilled in the art.

The open loop gain $A_O$ of a D-class amplifier can be regarded, in fact, to be virtually constant in frequency for frequency values $f_i$ of the input signal which are below the switching frequency $f_{sw}$ of the amplifier AMPL-D and there are no significant poles.

Considering the average value $\overline{V_o}$ of the modulated output signal from the amplifier, this can be likened to an ordinary operational amplifier having the same gain $A_O$ and no significant poles.

If a configuration of the inverting type is considered, also in connection with the scheme of FIG. 3, that is one where the input terminal IN2 is regarded as the inverting input terminal of the operational amplifier, to which the input signal Vi is applied while IN1 is connected to a ground, and if the open loop gain $A_O$ is sufficiently high, then the circuit node N can be regarded to be a virtual ground for the signal, and since the input current I=V1/R2, then:

$$\overline{V_o} = -R1 \cdot I = -\frac{R1}{R2} Vi$$

The capacitor C is placed between ground and a virtual ground, and therefore, no signal current will flow through it; gain has, in fact, the value of −R1/R2 regardless of the value of its capacitance.

If, to calculate the loop gain, the feedback is opened by connection of a voltage generator Vt therebetween, and by applying Thevenin's theorem, it can be readily seen that the differential error voltage at the input terminals has the following value:

$$Vd = Vt \cdot \frac{R2}{R1 + R2} \cdot \frac{1}{1 + s \cdot (R1//R2) \cdot C}$$

And since $V_O = A_O \cdot Vd$, loop gain is given by:

$$\frac{\overline{V_o}}{Vt} = -\frac{A_o}{1 + s \cdot (R2//R1) \cdot C} \cdot \frac{R2}{R1 + R2}$$

Therefore, loop gain will have a single pole at:

$$w_p = (R1//R2) \cdot C,$$

which can be brought within the audio frequency band by suitably sizing the resistors and capacitor, without altering the transfer function between the input and the output.

Figure 4:
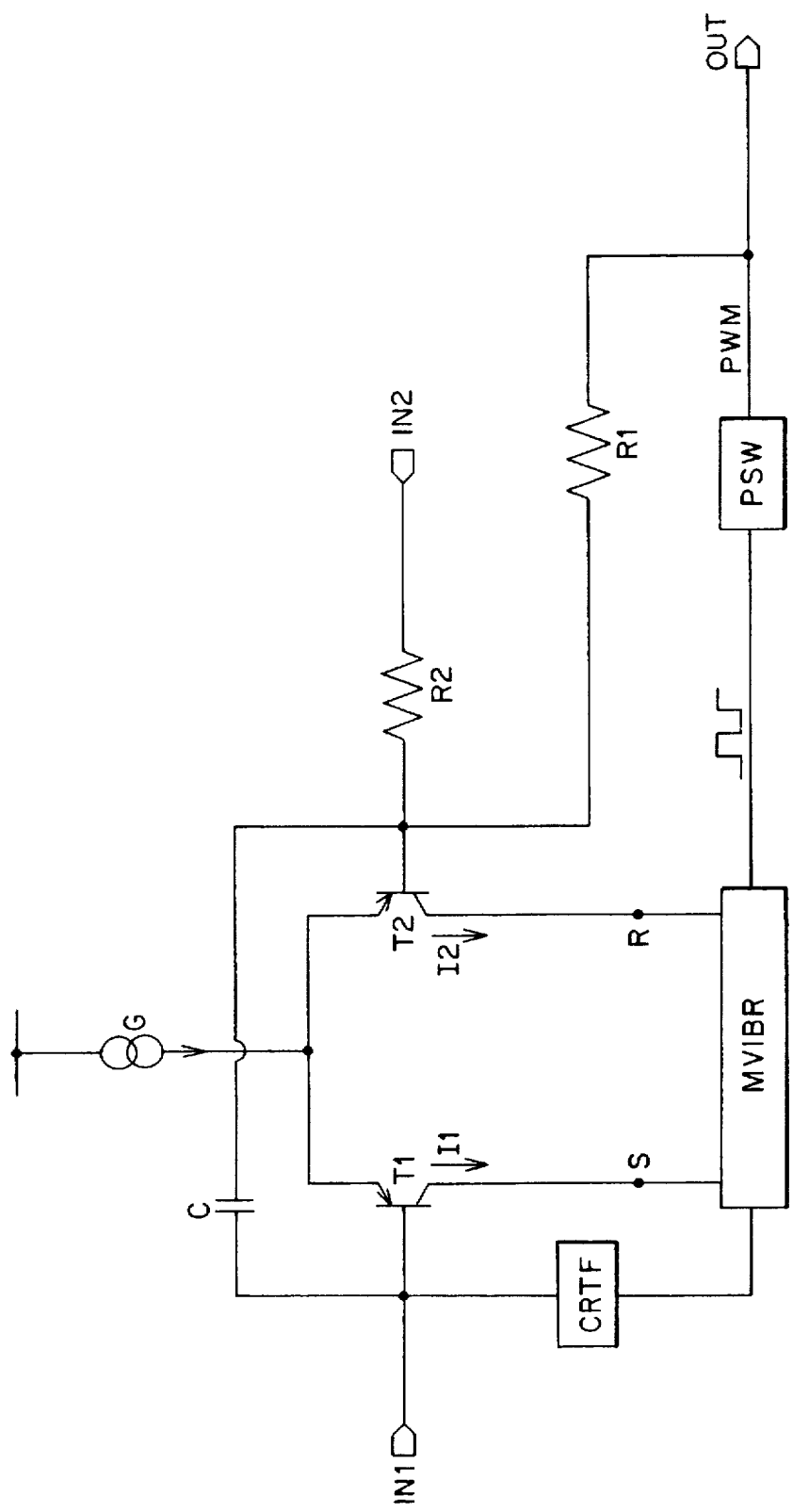
FIG. 4 shows a preferred embodiment of the general scheme shown in FIG. 3.

FIG. 4 shows a very simple circuit diagram which allows the pulse modulation of an analog signal to be carried out.

The feedback D-class amplifier of this embodiment of the invention includes a differential input structure comprised of two transistors, T1 and T2, and a constant current generator G.

The two output legs of the differential structure are connected to the inputs, S and R, of a bistable multivibrator MVIBR which is driven by the varying currents through the two legs to generate a pulse modulated output signal.

An active power element level-translating circuit PSW outputs a square waveform signal PWM capable of powering the load.

Also shown in the Figure is a frequency compensator CRTF, which functions to keep the switching frequency of the bistable multivibrator constant.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing is by way of example only and is not intended as limiting. The invention is limited only as defined in the claims and the equivalent thereto.

What is claimed:

1. A power amplifier of the two-state type having first and second inputs for receiving an input signal from a signal source and an output for providing an output signal, comprising:

a modulation circuit that converts the input signal to a pulse signal having a pulse duration proportional to an amplitude of the input signal, the modulation circuit having an output, coupled to the output of the amplifier, and first and second inputs coupled respectively to first and second input circuit nodes, the first input circuit node being coupled to the first input of the power amplifier;

a first circuit element, having a predetermined impedance, connected between the output of the and the second input of the modulation circuit;

a second circuit element, having a predetermined impedance, connected between the second input circuit node and the second input; and a capacitive element connected between the first input circuit node and the second input circuit node.

2. The power amplifier of claim 1, wherein the first and second circuit elements are resistors and the capacitive element is a capacitor.

3. A power amplifier of the two-state type having first and second inputs for receiving an input signal from a signal source, comprising:

a differential input stage having a first input terminal coupled to the first input of the power amplifier and a second input terminal and having first and second outputs;

a bistable type multivibrator circuit having first and second inputs respectively coupled to the first and second outputs of the differential input stage and having at least one output terminal;

a level-translating output stage having an input coupled to the at least one output terminal of the multivibrator circuit for converting a level of a signal received from the multivibrator circuit and having an output terminal for providing an output signal;

a first circuit element having a predetermined impedance connected between the output terminal of the level-translating stage and the second input terminal of the differential stage;

a second circuit element connected between the second input of the power amplifier and the second input terminal of the differential stage; and a capacitive element connected between the first and the second input terminals of the differential stage.

4. The power amplifier of claim 3, wherein the first and second circuit elements are resistors and the capacitive element is a capacitor.

5. The power amplifier of claim 1, further comprising a demodulation filter having an input coupled to the output of the modulation circuit and an output coupled to the output of the power amplifier.

6. The power amplifier of claim 3, further comprising a demodulation filter having an input coupled to the output of the level-translating stage.

7. An amplifier having first and second inputs for receiving an input signal from a signal source and an output for providing an output signal, comprising:

an amplification circuit that receives the input signal and provides an output amplified signal, the amplification circuit having an output, coupled to the output of the amplifier, and first and second inputs, the first input of the amplification circuit being coupled to the first input of the amplifier, the amplification circuit including a modulation circuit that converts the input signal to a pulse signal having a pulse duration proportional to an amplitude of the input signal;

a first circuit element having a predetermined impedance connected between the output and the second input of the amplification circuit;

a second circuit element having a predetermined impedance connected between the second input of the amplification circuit and the second input of the amplifier; and a capacitive element connected between the first input of the amplification circuit and the second input of the amplification circuit.

8. An amplifier having first and second inputs for receiving an input signal from a signal source and an output for providing an output signal, comprising:

an amplification circuit that receives the input signal and provides an output amplified signal, the amplification circuit having an output, coupled to the output of the amplifier, and first and second inputs, the first input of the amplification circuit being coupled to the first input of the amplifier, the amplification circuit including a modulation circuit that converts the input signal to a pulse signal having a pulse duration proportional to an amplitude of the input signal;

a first circuit element having a predetermined impedance connected between the output and the second input of the amplification circuit;

a second circuit element having a predetermined impedance connected between the second input of the amplification circuit and the second input of the amplifier;

a capacitive element connected between the first input of the amplification circuit and the second input of the amplification circuit; and wherein the modulation circuit includes:

a differential input stage having a first input coupled to the first input of the amplification circuit, a second input coupled to the second input of the amplification circuit and first and second outputs;

a bistable type multivibrator circuit having first and second inputs respectively coupled to the first and second outputs of the differential input stage and having at least one output;

a level-translating output stage that converts a level of a signal received from the multivibrator circuit having an input coupled to the at least one output of the multivibrator circuit and having an output coupled to the output of the amplification circuit.

9. The amplifier of claim 7, further comprising a demodulation filter having an input coupled to the output of the amplification circuit and an output coupled to the output of the amplifier.

10. An audio system having first and second inputs for receiving an input signal, comprising:

an amplification circuit that receives the input signal and provides an output amplified signal, the amplification circuit having an output and first and second inputs, the first input of the amplification circuit being coupled to the first input of the audio system, the amplification circuit including a modulation circuit that converts the input signal to a pulse signal having a pulse duration proportional to an amplitude of the input signal;

a first circuit element, having a predetermined impedance, connected between the output of the amplification circuit and the second input of the amplification circuit;

a second circuit element, having a predetermined impedance, connected between the second input of the amplification circuit and the second input of the audio system;

a capacitive element connected between the first input of the amplification circuit and the second input of the amplification circuit;

a demodulation filter, having an input coupled to the output of the amplification circuit to receive the output amplified signal and having an output that provides a filtered amplified signal; and an audio load coupled to the output of the demodulation filter to receive the filtered amplified signal.

11. An audio system having first and second inputs for receiving an input signal, comprising:

an amplification circuit that receives the input signal and provides an output amplified signal, the amplification circuit having an output and first and second inputs, the first input of the amplification circuit being coupled to the first input of the audio system, the amplification circuit including a modulation circuit that converts the input signal to a pulse signal having a pulse duration proportional to an amplitude of the input signal;

a first circuit element, having a predetermined impedance, connected between the output of the amplification circuit and the second input of the amplification circuit;

a second circuit element, having a predetermined impedance, connected between the second input of the amplification circuit and the second input of the audio system;

a capacitive element connected between the first input of the amplification circuit and the second input of the amplification circuit;

a demodulation filter, having an input coupled to the output of the amplification circuit to receive the output amplified signal and having an output that provides a filtered amplified signal;

an audio load coupled to the output of the demodulation filter to receive the filtered amplified signal; and wherein the modulation circuit includes:

a differential input stage having a first input coupled to the first input of the amplification circuit, a second input coupled to the second input of the amplification circuit and first and second outputs;

a bistable type multivibrator circuit having first and second inputs respectively coupled to the first and second outputs of the differential input stage and having at least one output;

a level-translating output stage that converts a level of a signal received from the multivibrator circuit having an input coupled to the at least one output of the multivibrator circuit and having an output coupled to the output of the amplification circuit.

12. A power amplifier of the two-state type having first and second inputs for receiving an input signal from a signal source and an output for providing an output signal, comprising:

a modulation circuit that converts the input signal to a pulse signal having a pulse duration proportional to an amplitude of the input signal, the modulation circuit having an output, coupled to the output of the amplifier, and first and second inputs, the first input of the modulation circuit node being coupled to the first input of the power amplifier;

feedback means for providing a feedback signal from the output of the amplifier to the first and second inputs of the modulation circuit, the feedback means being coupled to the output of the amplifier and to the first and second inputs of the modulation circuit.

13. The power amplifier of claim 12, wherein the feedback means is constructed and arranged such that a transfer function of the power amplifier has only one pole in an operational frequency band of the power amplifier.

* * * * *